(12) United States Patent
Tabib-Azar (10) Patent No.: US 7,640,226 B2
(45) Date of Patent: Dec. 29, 2009

(54) SELF-WELDED METAL-CATALYZED CARBON NANOTUBE BRIDGES AND SOLID ELECTROLYTIC NON-VOLATILE MEMORIES

(75) Inventor: Massood Tabib-Azar, Shaker Heights, OH (US)

(73) Assignee: Case Western Reserve University, Cleveland, OH (US)

(*) Notice: Subject to any disclaimer, the term of this patent is extended or adjusted under 35 U.S.C. 154(b) by 207 days.

(21) Appl. No.: 11/561,212

(22) Filed: Nov. 17, 2006

(65) Prior Publication Data

US 2009/0288599 A1 Nov. 26, 2009

Related U.S. Application Data

(60) Provisional application No. 60/738,286, filed on Nov. 18, 2005.

(51) Int. Cl.
*G06N 5/00* (2006.01)
(52) U.S. Cl. .......................................... 706/62; 706/45
(58) Field of Classification Search .................. 706/14, 706/45, 62; 977/720, 721
See application file for complete search history.

(56) References Cited

OTHER PUBLICATIONS

M Saif Islam et al, Ultrahigh-density silicon nanobridges formed between two vertical silicon surfaces, Jan. 2004, Institute of Physics Publishing, L5-L8.*
Massood Tabib-Azar et al., Mechanical properties of self-welded silicon nanobridges, Sep. 6, 2005, Applied Physics Letters, 1-3.*

Yoshikazu Homma, Growth of supended carbon nanotube networks on 100-nm-scale silicon pillars, Sep. 16, 2002, Applied Physics Letters, 2261-2263.*
T. Sakamoto, Nanometer-scale switches using copper sulfide, May 5, 2003, Applied Physics Letters, 3032-3034.*
Islam et al, Ultrahigh-density silicon nanobridges formed between two vertical silicon surfaces, Jan. 2004, Institute of Physics Publishing, L5-L8.*
T. Junno, et al. Controlled Manipulation of Nanoparticles with an Atomic Force Microscope. Appl. Phys. Lett. 66 (26), Jun. 26, 1995, 0003-6951/95/66(26)/3627/3. Last accessed Dec. 20, 2006, 3 pages.
Claes Thelander, et al. Gold Nanoparticle Single-Electron Transistor with Carbon Nanotube Leads. Applied Physics Letters, vol. 79, No. 13, Sep. 24, 2001. DOI: 10.1063/1.1405154. 0003-6951/2001/79(13)/2106/3. Last accessed Dec. 20, 2006, 3 pages.
Ali Javey, et al. Electrical Properties and Devices of Large-Diameter Single-Walled Carbon Nanotubes. Applied Physics Letters, vol. 80, No. 6, Feb. 11, 2002. DOI: 10.1063/1.1448850. 0003-6951/2002/80(6)/1064/3. Last accessed Dec. 19, 2006, 3 pages.
T. Sakamoto, et al. Nanometer-scale Switches Using Copper Sulfide. Applied Physics Letters, vol. 82, No. 18, May 5, 2003. DOI: 10.1063/1.1572964. 0003-6951/2003/82(18)/3032/3. Last accessed Dec. 20, 2006, 3 pages.

(Continued)

*Primary Examiner*—Wilbert L Starks, Jr.
(74) *Attorney, Agent, or Firm*—Tarolli, Sundheim, Covell & Tummino LLP (57) ABSTRACT

Systems and methods for simultaneously creating a plurality of carbon nanotubes on substrates and across large wafers via employing vapor deposition of material on the surface of the substrate and fluid flow to aid in and direct the growth of the nanotubes in pre-specified locations and directions. In addition, the nanotubes created can be used as gas and chemical sensors, electronic switches, resonators, and non-volatile memory devices.

11 Claims, 10 Drawing Sheets

OTHER PUBLICATIONS

Y. F. Hsiou, et al. Controlled Placement and Electrical Contact Properties of Individual Multiwalled Carbon Nanotubes on Patterned Silicon Chips. Applied Physics Letters, vol. 84, No. 6, Feb. 9, 2004. DOI: 10.1063/1.1645985. 0003-6951/2004/84(6)/984/3. Last accessed Dec. 20, 2006, 3 pages.

Tarek A. El-Aguizy, et al. Transplanting Carbon Nanotubes. Applied Physics Letters, vol. 85, No. 24, Dec. 13, 2004. DOI: 10.1063/1.1836865. 0003-6951/2004/85(24)/5995/3. Last accessed Dec. 20, 2006, 3 pages.

Min-Feng Yu, et al. Controlled Sliding and Pullout of Nested Shells in Individual Multiwalled Carbon Nanotubes. J. Phys. Chem. B 2000, 104, 8764-8767. Published on Web Aug. 24, 2000, 10.1021/jp002828d. Last accessed Dec. 21, 2006, 4 pages.

K. B. K. Teo, et al. Fabrication and Electrical Characteristics of Carbon Nanotube-Based Microcathodes for Use in a Parallel Electron-Beam Lithography System. Published Feb. 12, 2003. DOI: 10.1116/1.1545755. J. Vac. Sci. Technol. B 21(2) , Mar./Apr. 2003. 1071-1023/2003/21(2)/693/5. Last accessed Dec. 20, 2006, 5 pages.

M. Tabib-Azar, et al. Non-Volatile Solid-Electrolyte Memory Devices: Electronic versus Optical Latent Image Formation in Silver and Copper Halides. Last accessed Nov. 9, 2007, 9 pages.

M. Tabib-Azar, et al. Self-Welded Metal-Catalyzed Carbon Nanotube Piezoresistors with Very Large Longitudinal Piezoresistivity of ~ 4×10−8 Pa-1. Proceedings of the 1st IEEE International Conference on Nano/Micro Engineered and Molecular Systems, Jan. 18-21, 2006, Zhuhai, China. Last accessed Jan. 16, 2008, 6 pages.

M. Saif Islam, et al. Ultrahigh-Density Silicon Nanobridges Formed between Two Vertical Silicon Surfaces, Institute of Physics Publishing, Nanotechnology 15 (2004) L5-L8, PII: S0957-4484(04)69293-2. Published Jan. 23, 2004, DOI: 10.1088/0957-4484/15/5/L01. http://stacks.iop.org/Nano/15/L5. Last accessed Dec. 20, 2006, 5 pages.

Nathan R. Franklin, et al. An Enhanced CVD Approach to Extensive Nanotube Networks with Directionality. Adv. Mater. 2000, 12, No. 12, Wiley-VCH Verlag GmbH, 0935-9648/00/1206-0890. Last accessed Dec. 20, 2006, 5 pages.

Y. Y. Wei, et al. Directed Assembly of Carbon Nanotube Electronic Circuits. Applied Physics Letters, vol. 76, No. 25, Jun. 19, 2000. American Institute of Physics, S0003-6951(00)00125-X, 0003-6951/2000/76(25)/3759/3. Last accessed Dec. 20, 2006, 3 pages.

Yuegang Zhang, et al. Electric-Field-Directed Growth of Aligned Single-Walled Carbon Nanotubes. Applied Physics Letters, vol. 79, No. 19, Nov. 5, 2001. American Institute of Physics, DOI: 10.1063/1.1415412, 0003-6951/2001/79(19)/3155/3. Last accessed Dec. 20, 2006, 3 pages.

Yoshikazu Homma, et al. Growth of Suspended Carbon Nanotube Networks on 100-nm-scale Silicon Pillars. Applied Physics Letters, vol. 81, No. 12, Sep. 16, 2002. American Institute of Physics, DOI: 10.1063/1.1507840, 0003-6951/2002/81(12)/2261/3. Last accessed Dec. 20, 2006, 3 pages.

H. B. Peng, et al. Patterned Growth of Single-Walled Carbon Nanotube Arrays from a Vapor-Deposited Fe Catalyst. Applied Physics Letters, vol. 83, No. 20, Nov. 17, 2003. American Institute of Physics, DOI: 10.1063/1.1627935, 0003-6951/2003/83(20)/4238/3. Last accessed Dec. 20, 2006, 3 pages.

M. Tabib-Azar, et al. Mechanical Properties of Self-Welded Silicon Nanobridges. Applied Physics Letters, 87, 113102 (2005), published online Sep. 6, 2005. American Institute of Physics, DOI: 10.1063/1.2042549, 0003-6951/2005/87(11)/113102/3. Last accessed Dec. 20, 2006, 3 pages.

Philip G. Collins, et al. Extreme Oxygen Sensitivity of Electronic Properties of Carbon Nanotubes. Science 287, 1801 (2000); DOI: 10.1126/science.287.5459.1801, Mar. 10, 2000. Last accessed Dec. 22, 2006, 5 pages.

M. Tabib-Azar. CuS and AgS Solid-Electrochemical Cells as Non-Volatile Memory Devices. Last accessed Jan. 16, 2008, 1 page.

M. Tabib-Azar, et al. Sensitive NH3OH and HCL Gas Sensors Using Self-Aligned and Selfwelded Multi-Walled Carbon Nanotubes. 0-7803-9056-3/05 IEEE. Last accessed Dec. 21, 2006, 4 pages.

A. Krishnan, et al. Young's Modulus of Single-Walled Nanotubes. Physical Review B, vol. 58, No. 20, Nov. 15, 1998-II. The American Physical Society, S0163-1829(98)00144-1, 0163-1829/98/58(20)/14013(7). Last accessed Dec. 20, 2006, 7 pages.

* cited by examiner

SELF-WELDED METAL-CATALYZED CARBON NANOTUBE BRIDGES AND SOLID ELECTROLYTIC NON-VOLATILE MEMORIES

CROSS-REFERENCE TO RELATED APPLICATIONS

This application claims the benefit of U.S. Provisional Application Ser. No. 60/738,286 filed on Nov. 18, 2005, and entitled SELF-WELDED METAL-CATALYZED CARBON NANOTUBE BRIDGES AND SOLID ELECTROLYTIC NON-VOLATILE MEMORIES. The entirety of the aforementioned application is incorporated herein by reference.

BACKGROUND

Nanotechnology, often referred to as the science of developing atomic and molecular level materials, is concerned with exploiting the special electrical, mechanical, thermal, physical and chemical properties of nanometer-scale substances both individually and in conjunction with each other and other materials. These nano-materials are typically less than 100 nanometers in size, making them ideal for applications such as computer storage, semiconductors, biotechnology, manufacturing and energy. Nanotechnology encompasses the new and evolving techniques used to create these materials. Applications of nanotechnology in electronic devices and circuits involve utilizing existing silicon technologies and extending current capabilities by adding the unique properties of nanodevices and interconnects. Nanotechnology is an area of intense research and commercial activity that is evolving rapidly.

Carbon nanotubes are relatively new structures with useful applications, for instance, in sensors, actuators, displays, light emitting devices (LEDs), solar cells and electronics. A nanotube is a minute straw-like cylinder of carbon (e.g., 10,000 times thinner than a human hair) and can have outstanding commercial values and scientific properties; as such, carbon nanotubes (CNT) have attracted tremendous research interest. CNTs have a high Young's modulus (e.g., greater than 1.2 TPa) and can be used in gigahertz mechanical resonators used in on-chip clocks and/or on chemical and physical sensors.

To fabricate CNT-based devices and circuits, the CNTs can be placed at particular locations near specific contacts. To position CNTs in desired locations, various categories of techniques can be employed. In a first category called "post-processing methods", the CNTs are grown separately and are deposited and patterned or positioned on suitable contacts or on suitable substrates. Pads can be fabricated over these CNTs to form the devices. In a second category called "in-situ methods", an externally applied field is used to direct the growth of CNTs between the contact pads. Presently, single walled carbon nanotubes (SWCNT) and multi-walled carbon nanotubes (MWCNT) are subject to numerous studies at research facilities and universities.

Carbon nanotube bridges have many applications in nano-electronics and nano-electromechanical resonators. The CNT bridges are CNTs grown between two contacts (e.g., on a computer chip). With the evolution of CNT bridges, scientists and researchers have been developing various growth and/or formation techniques. One commonly employed technique utilizes an electric field that directs growth of the CNTs between contacts. In another technique, gas flow can be implemented to create CNTs in a substantially similar manner. Yet another technique involves post growth processing, wherein the CNTs, deposited from a solution on a substrate, are positioned between contacts using an atomic force microscope (AFM). Photolithography, a widely used technique in electronic chip manufacture, can be employed to etch away material, thereby leaving CNT electrodes over the contacts. Further, another technique can place the electrodes on the CNTs after determining location using a scanning electron microscope (SEM) or AFM.

Conventional techniques utilized to create CNTs across contacts may not be feasible for commercial applications. For instance, the electric field approach is not scalable. An ultra-large scale integrated circuit that includes at least $10^{10}$ transistors may not allow application of external electric fields to the individual drain and source contacts to grow the CNTs. In addition, the gas flow pattern technique does not always provide proper alignment and self-welding of CNTs. Furthermore, mounting of CNTs using the AFM is laborious and suitable mostly in exploratory single device studies in research laboratories. The photolithography technique also has deficiencies since CNTs can be positioned in random locations in the electrode regions based at least in part upon the difficulty of assembling CNTs on regular periodic arrays in liquids. Typically, the above techniques utilize an additional step, wherein a metallic layer is evaporated over the CNT to provide stability to contact joint. Accordingly, even if one side of the CNT attaches firmly to one of the contacts, the other side likely has a much weaker bond that typically needs to be re-enforced. This often results in dissimilar mechanical and electrical properties of the CNT joints while the user would prefer the properties to be uniform.

SUMMARY

The following presents a simplified summary in order to provide a basic understanding of some aspects of the claimed subject matter. This summary is not an extensive overview. It is not intended to identify key/critical elements or to delineate the scope of the claimed subject matter. Its sole purpose is to present some concepts in a simplified form as a prelude to the more detailed description presented later.

The subject innovation provides for systems and methods that enhance CNT growth techniques resulting in self-welded single-walled and multi-walled CNTs grown between silicon or other appropriate posts. To achieve self-welding, a functionalized surface of one of the posts can allow the CNT to grow into that surface forming a very strong bond. The functionalized surface can be a carbon-covered post that can allow the carbon atoms in the CNT to attach themselves to the carbon atoms on the surface of the post. Additionally or alternatively, the functionalized surface can comprise disparate active layers that support growing CNTs, forming a strong bond, and/or creating a junction for a variety of active devices. This bonding process can be demonstrated and confirmed by growing CNTs on an amorphous carbon layer. For example, bond strength measurements using AFM load-displacement measurements and related electrical measurement symmetry can be utilized for the samples. These samples show that the bond strength identified via employing the AFM technique can be quite large and can be higher than self-welded silicon wires. An aspect of the innovation presented can address a difficulty in CNT-based electronics and electromechanical bridges: namely, simultaneously growing self directed nanotubes across large wafers that can weld themselves to the opposite posts without the aid of an electric field or other localized and externally applied forces.

To the accomplishment of the foregoing and related ends, certain illustrative aspects of the claimed subject matter are described herein in connection with the following description and the annexed drawings. These aspects are indicative of various ways in which the subject matter can be practiced, all of which are intended to be within the scope of the claimed subject matter. Other advantages and novel features may become apparent from the following detailed description when considered in conjunction with the drawings.

Appendix A is an article that further details various aspects of the subject innovation, and this appendix is considered part of the detailed description of this application.

Appendix B is a collection of illustrations/examples in connection with particular aspects of the innovation, and this appendix is considered part of the detailed description of the application.

Appendix C is an article that further details various aspects in connection with the subject innovation, and this appendix is considered part of the detailed description of this application.

DETAILED DESCRIPTION

The various aspects of the subject innovation are now described with reference to the annexed block diagrams and drawings, wherein like numerals refer to like or corresponding elements throughout. It should be understood, however, that the block diagrams, drawings and detailed description relating thereto are not intended to limit the claimed subject matter to the particular form disclosed. Rather, the intention is to cover all modifications, equivalents, and alternatives falling within the spirit and scope of the claimed subject matter.

As used herein, the terms "component," "system," "generator" and the like are intended to refer to a system, method, apparatus or article of manufacture. The word "exemplary" is used herein to mean serving as an example, instance, or illustration. Any aspect or design described herein as "exemplary" is not necessarily to be construed as preferred or advantageous over other aspects or designs. Furthermore, the disclosed subject matter may be implemented as a system, method, apparatus, or article of manufacture.

Figure 1:
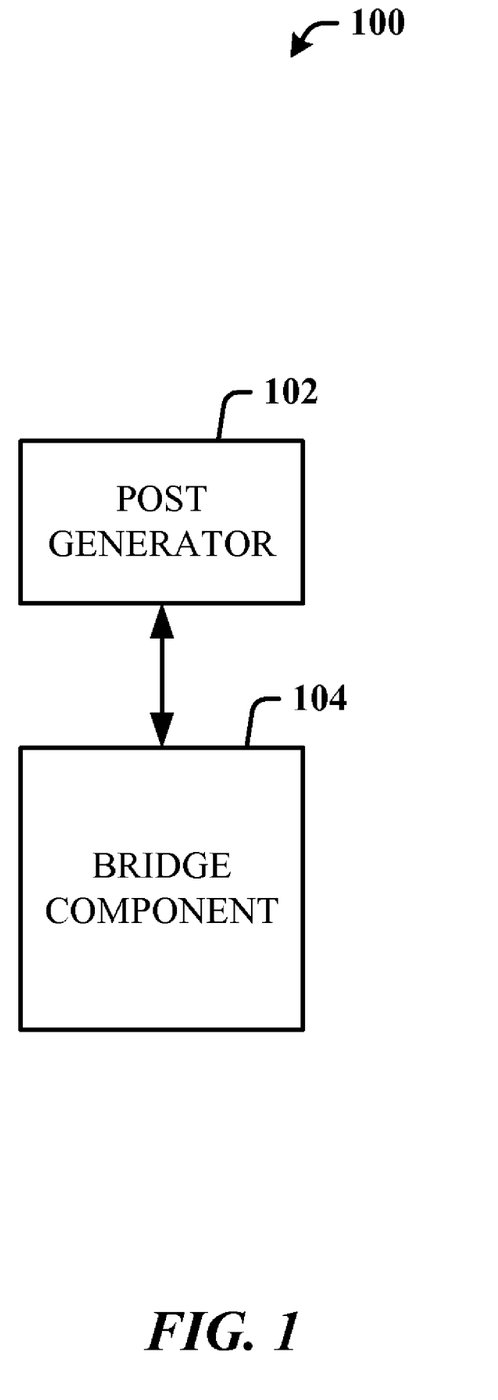
FIG. 1 illustrates a block diagram of an exemplary system that facilitates generating a nanotube bridge between two posts.

Now turning to the figures, FIG. 1 illustrates a system 100 that facilitates generating a nanotube bridge between two posts. The system 100 can include a post generator 102 that facilitates producing at least one post and a bridge component 104 that grows at least one self-welding nanotube bridge between the at least one post. In an example, the post generator 102 can create two posts, wherein a bridge component 104 can grow a nanotube bridge therebetween. Such posts can be defined by utilizing, for instance, photolithography, deep reactive etching, and/or other suitable integrated circuit fabrication techniques. It is to be appreciated and understood that the post generator 102 can create a plurality of posts on separate silicon substrates/wafers and/or on a single silicon substrate/wafer. Furthermore, it is to be appreciated that the bridge component 104 can grow a nanotube bridge that attaches to a post, a plurality of nanotube bridges between two posts, and/or a plurality of nanotube bridges between a plurality of posts based at least in part upon the particular application. In this way an ultra-large integrated circuit can be created, for example.

According to an example, the post generator 102 creates posts on two disparate silicon substrates. Upon the creation of the post, the bridge generator 104 can grow a nanotube bridge such that the bridge provides connectivity between the two disparate silicon posts. It is to be appreciated that the growth of the posts and/or the nanotube bridges can be performed utilizing various manufacturing and chemical processes and/or operations. For instance, atomic force microscopy, scanning electron micrography, low pressure chemical vapor deposition (LPCVD), reactive ion etching, etc. can be employed in connection with growing the posts and/or nanotube bridges; however, the claimed subject matter is not so limited. According to an example, the bridge generator 104 can employ fluid flow to enable growth of the nanotube(s). Pursuant to this example, the fluid used by the bridge generator 104 can be any fluid such as, for example, acetylene gas and argon gas. It is also to be appreciated that the silicon substrates/wafers and nanotube bridges can be validated utilizing various mechanical and electrical validation processes to evaluate the validity of the posts, bridge joints, substrates, wafers, etc. For instance, electrical and/or structural characteristics can be validated to evaluate CNT integrity.

In another example, a grown nanotube between at least two posts can be separated and/or stretched. Such elongation and/or stretching can provide a reduction of wall thickness related to the nanotube. Accordingly, the system 100 and the bridge component 104 can be utilized to facilitate changing wall thickness and/or length of the nanotube. Pursuant to an illustration, by separating the posts a distance, such distance can correlate to an elongation of the nanotube bridge, thus reducing nanotube bridge wall thickness.

Figure 2:
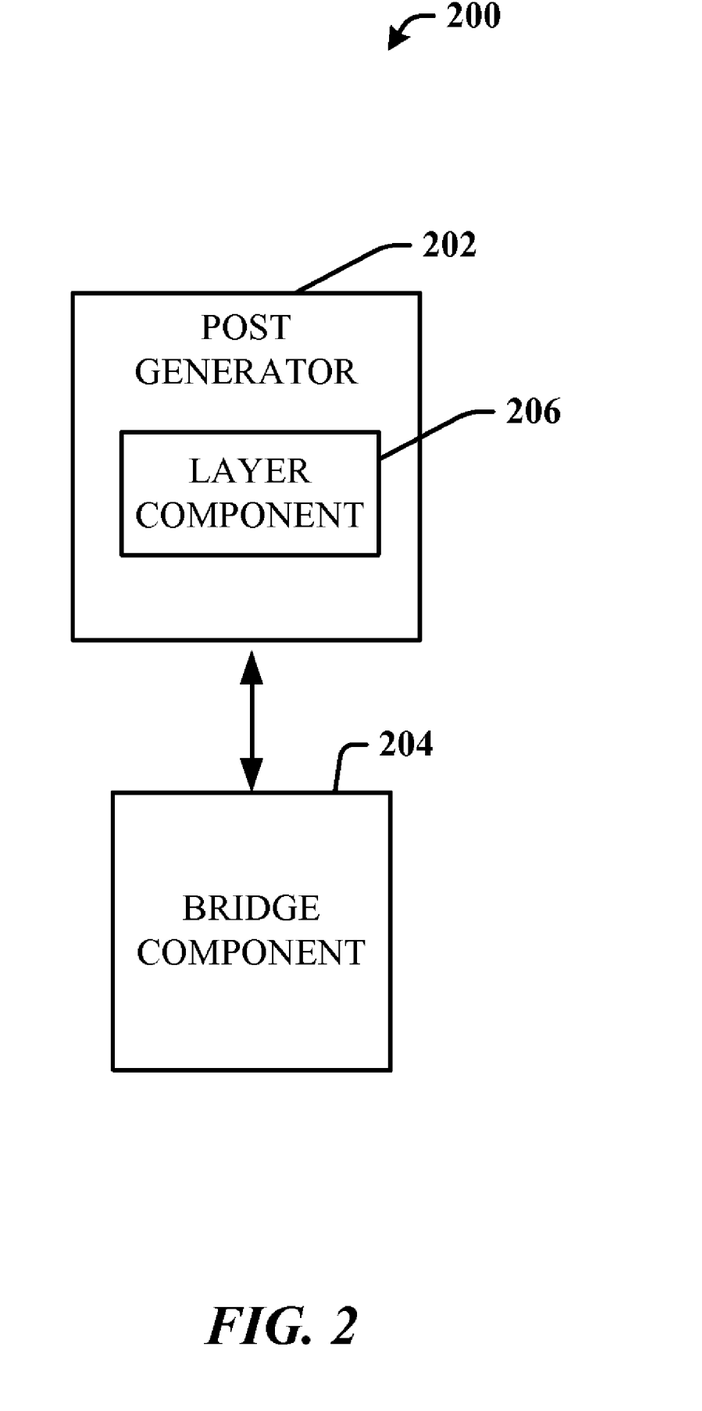
FIG. 2 illustrates a block diagram of an exemplary system that facilitates generating a nanotube bridge between two posts that have vaporized metallic layers therewith.

FIG. 2 illustrates a system 200 that facilitates depositing a metallic or other suitable layer on the posts via a layer component 206. As depicted, a post generator 202, which can produce a post, can include the layer component 206. The metallic layer formed via the layer component 206 facilitates growing at least one nanotube bridge between two silicon posts by utilizing a bridge component 204. It is to be appreciated that the deposited metallic layer can be a single metallic layer deposited on the posts or a plurality of metallic layers deposited on the posts. It should also be appreciated that the metallic layer can be deposited on a portion of the post or the entire portion of the post. Further, the layer component 206 can deposit the metallic layer upon a subset of the posts utilized in connection with the system 200, while the metallic layer can be withheld from the remainder of the subset of posts. The metallic layer deposited by the layer component 206 can be produced utilizing various processes, for instance, low pressure chemical vapor deposition (LPCVD) and/or thermal evaporation. The system 200 can utilize pre-processing in connection with a post to deposit a thin layer of metal on the post. The layer component 206 can deposit the metallic layer off-axis by, for instance, utilizing a thermal evaporator and/or a chemical vapor deposition chamber. By depositing the metallic vapor off-axis, the metal can be masked to allow only particular portions of the post to be layered. For instance, the metallic layer can be masked such that only the upper surface of the post is to be layered.

In an example, a thin layer of aluminum can be sputtered on the post while controlling parameters (e.g., power, temperature, gas flow rates, types of gases, . . . ). The aluminum can further be patterned with photoresist and/or wet etched. The photoresist process allows areas not covered with photoresist to be etched away while those areas covered with photoresist are protected. A solvent can be utilized to remove the photoresist to prepare for an additional application and/or patterning of photoresist being applied prior to a deep reactive ion etching (DRIE) process. Further, the claimed subject matter is not limited to the type of photoresist or metallic layer described herein and any type of layer and photoresist can be employed. By implementing the above, the system 200 chemically treats the silicon substrate/wafer in order to create posts with at least one metallic layer. In another example, multiple layers of metal can be deposited on the silicon substrates/wafers and chemically etched to create posts with a plurality of layers of metal deposited on one or more respective posts.

Figure 3:
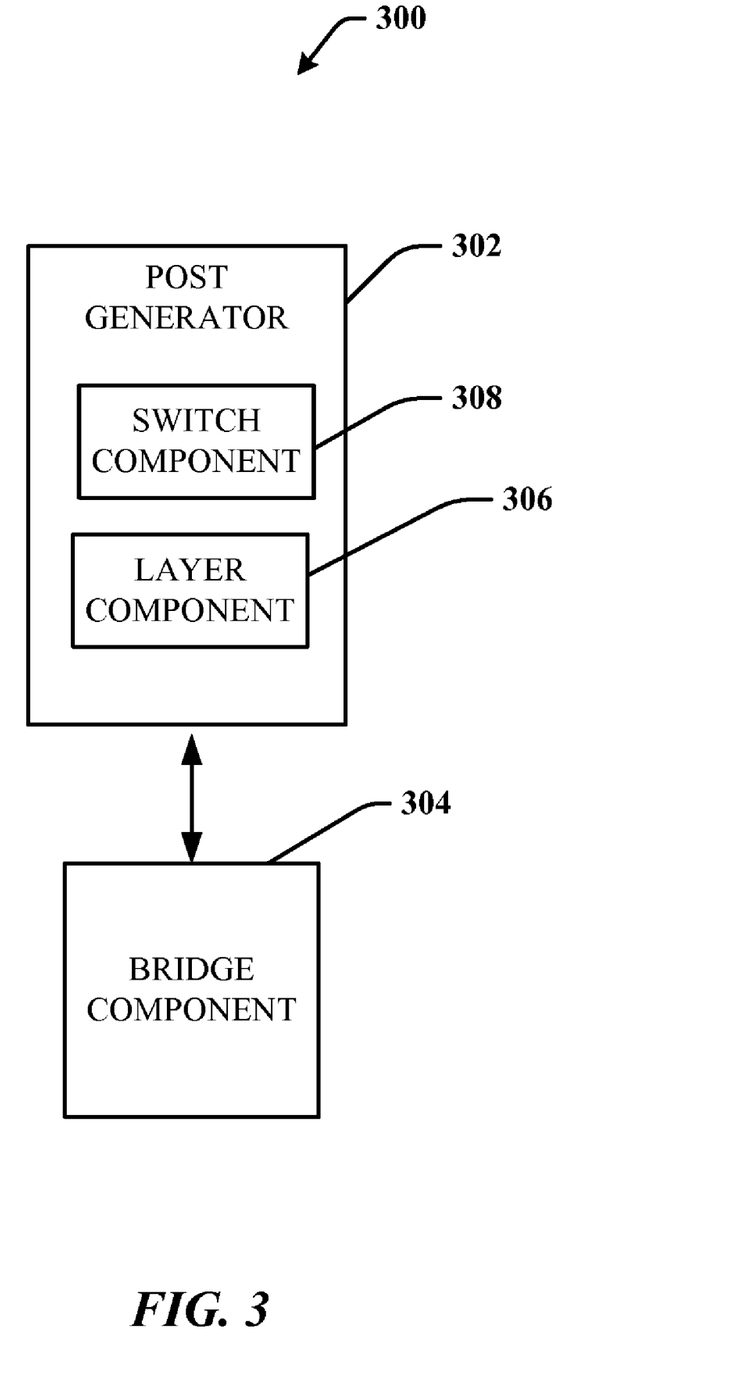
FIG. 3 illustrates a block diagram of an exemplary system that facilitates creating a switch utilizing a nanotube bridge.

FIG. 3 illustrates a system 300 that facilitates creating silicon substrate/wafer posts having a deposited metallic layer, utilizing a post generator 302 and a layer component 306. A bridge component 304 facilitates growing a nanotube bridge between two posts having vaporized metallic layers. The post generator 302 can further include a switch component 308 that creates a non-volatile switch or any other electronic device or gas and chemical sensors utilizing a nanotube bridge between two disparate posts. The switch component 308 allows the grown nanotube to be utilized as a switch in any suitable electrical circuit, circuit board, and/or circuitry.

In one example, the switch component 308 can create at least one switch between two distinct silicon posts, wherein such posts can be created by the post generator 302. A metallic layer of copper can be deposited on at least one of the posts facilitating the creation of a switch by growing a nanotube bridge between a disparate post and the copper metallic layer. In another example, the copper can be sulfidized, iodized or reacted with any other chemicals by the layer component 306 to produce a thin layer of copper sulfide or other suitable substance that forms an active junction with the nanotube bridge. Furthermore, it is to be appreciated that the deposited metallic layer can be a single copper and/or CuS layer or any other metal or any other material (e.g., metallic, semiconducting, superconducting, semi-insulating and/or insulating) deposited on the posts or a plurality of metallic layers deposited on the posts. The nanotube bridge-CuS junction can exhibit switching characteristics applicable in non-volatile memory devices and/or other switching devices and in various gas and chemical sensing devices. For example, in its applications in non-volatile memory devices, upon injection of electrons into the CuS region by the negatively-biased nanotube, a region with neutral Cu atoms can readily be formed that has metallic conductivity. The voltage polarity can be reversed so that the Cu-rich region becomes depleted and thereby switches off the device. In particular, the nanotube bridge can exhibit switching characteristics by injecting electrons into the saturation area, thereby reducing the device current and switching off the device. It is to be appreciated that the metallic layer can be any suitable metal and the claimed subject matter is not so limited by the implementation of Cu.

In yet another example, a plurality of the switches are created on an ultra-large integrated circuit between a plurality of posts with at least one layer of metal deposited on said posts. It is to be understood that a plurality of metallic layers and a plurality of metallic materials can be deposited on each particular post. It is also to be appreciated that the nanotube bridges can be utilized to create switches and/or connectors between the plurality of posts.

Figure 4:
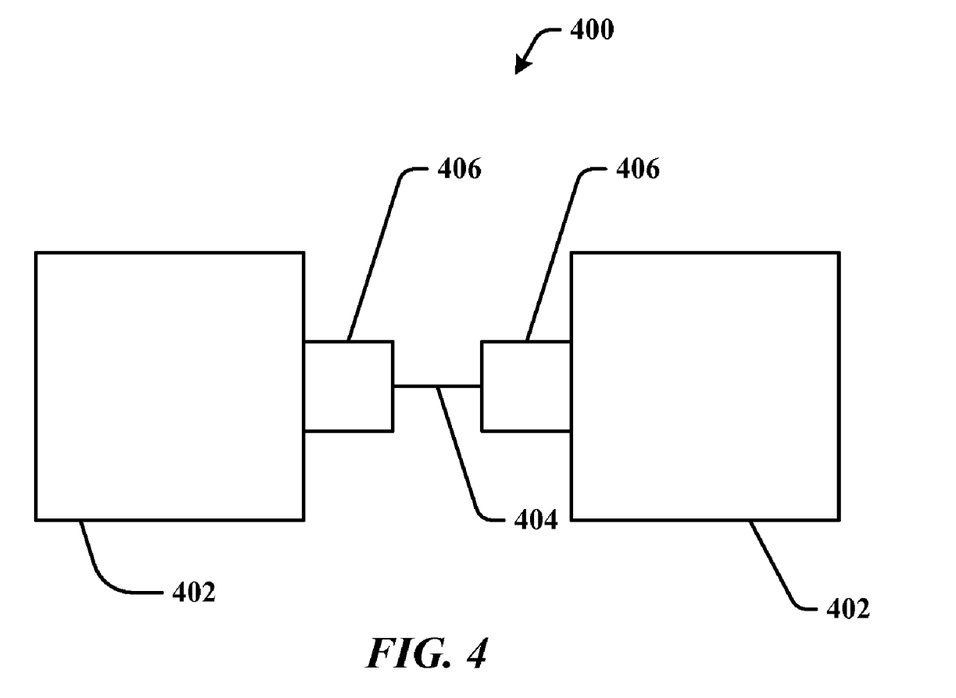
FIG. 4 illustrates is a schematic top view of two silicon wafers with a nanotube bridge therebetween in accordance with an aspect of the subject innovation.

FIG. 4 is a top view schematic 400 of silicon substrate/wafer contact pads 402 with a nanotube bridge 404 shown between two posts 406. The contact pads 402 can provide electrical connections between the nanotube bridge 404 and the posts 406. The top of the posts 406 and/or the top of the contact pads 402 can be layered with metal (not shown) (e.g., copper, iron, carbon, silver, . . . ). The nanotube bridge 404 is grown from the metallic layer on the top of one post 406 to the layer of metal of the disparate post 406, creating a self-weld to the metallic layer on the disparate post 406. The nanotube bridge 404 connection to the disparate post 406 is substantially similar in relation to voltage and current characteristics as the nanotube bridge 404 connection to the post 406 from which the nanotube bridge 404 was grown. It should be appreciated that the nanotube bridge 404 can be grown and self-welded between two disparate posts 406 without utilizing an electric field.

In one example, a layer of aluminum, iron and/or carbon can be selectively deposited on a surface of the posts 406. These metallic materials can be deposited in a narrow band near the top of the silicon post 406 by an off-axis deposition process. These posts 406 located on the silicon substrate/wafers can be heated in a gas flow allowing the nanotube bridge 404 to grow between the disparate posts 406. In another example, the gap between disparate posts 406 can be increased by moving the silicon substrates. Thus, the fully grown nanotube bridge 404 can be elongated to increase the length and/or reduce the wall thickness of the nanotube.

Figure 5:
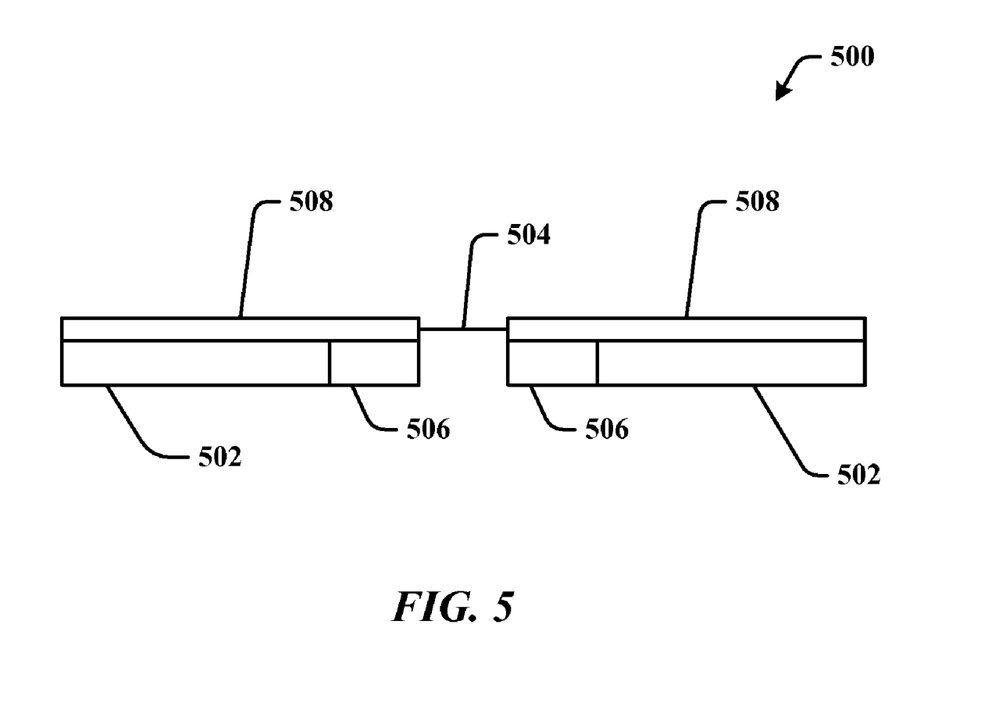
FIG. 5 illustrates is a schematic side view of two silicon wafers with a nanotube bridge therebetween in accordance with an aspect of the claimed subject matter.

FIG. 5 illustrates a schematic side view 500 of two silicon wafers with a nanotube bridge 504 therebetween in accordance with an aspect of the claimed subject matter. Contact pads 502 and posts 506 are shown with a metallic layer 508 deposited on an upper surface. The nanotube bridge 504 as shown is self welded into the metallic layer 508. It should be appreciated that the nanotube bridge 504 can be grown from either of the metallic layers 508 and self welded to the disparate metallic layer 508.

For example, the nanotube bridge 504 can readily be grown within the gap between the disparate posts 506 while growth can be inhibited outside of this gap. Pursuant to this example, the metallic layer 508 can include aluminum which can preclude growth of the nanotube bridge 504 over that metallic layer. The aluminum can act as a nanotube bridge 504 growth inhibitor which under certain conditions (e.g., temperature, gas flow rate, . . . ) can suppress nanotube bridge 504 growth. A possible mechanism for this growth suppression is that at high temperatures, the aluminum can soften and/or dissolve iron nanoparticles, thereby possibly diminishing the nanoparticles' catalytic ability. The nanotube bridges 504 may not grow in other regions that are not covered with aluminum such as, for example, on the walls of the side region of the posts 506. This lack of growth can be caused by surface currents that can generate strong boundary layer shear forces and those currents can "cool" down those regions below the nanotube bridge 504 growth temperature. In addition, the nanotube bridges 504 can be suspended away from the posts 506 using a combination of surface gas currents and van der Wall interactions.

Figure 6:
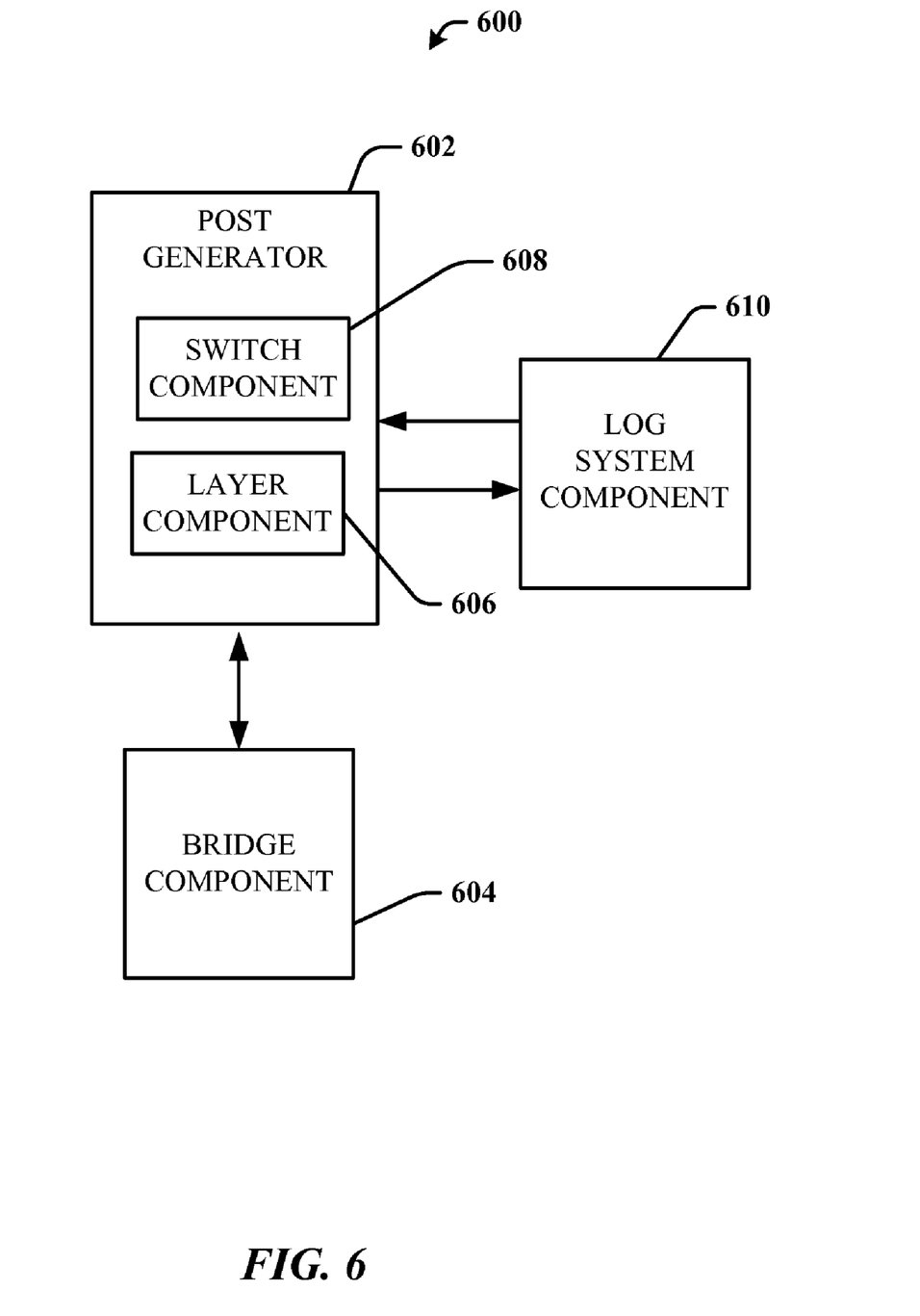
FIG. 6 illustrates a block diagram of an exemplary system that facilitates growing a nanotube bridge implementing a data storage component.

FIG. 6 illustrates a system 600 that facilitates creating a nanotube bridge. A post generator 602 can generate at least one silicon post. Additionally, the post generator 602 can include a layer component 606 that can deposit a layer upon the at least one silicon post generated. A bridge component 604 can grow at least one nanotube bridge between two disparate silicon posts. Furthermore, a switch component 608 can create at least one switch between two distinct silicon posts to be utilized in non-volatile memory devices (discussed supra).

The system 600 can further include a log system component 610 that facilitates storing and/or accessing data to achieve enhanced manufacturing and validation of ultra-large integrated circuits. For example, the log system component 610 can include information about the post generator 602 and the bridge component 604 such as, but not limited to, post metrics, bridge metrics, mechanical characteristics, electrical characteristics, etc. In another example, the log system component 610 can drive standardization in the manufacturing processes. The layer component 606 within the post generator 602 can measure the metallic layer deposited on the post and if the thickness becomes inconsistent, the system 600 can schedule servicing so that there is the least amount of disruption in the manufacturing process. Furthermore, the log system component 610 can utilize common data store technology for representing, configuring, editing, entering, and communicating the data contained therein. In addition, the log system component 610 can take advantage of direct access to the stored information for driving the manufacturing processes.

According to an example, the log system component 610 can collect data to utilize for future fabrication of a nanotube bridge. The log system component 610 can collect data of sensors during manufacturing operations (e.g., temperature, time, gas flow rate, type of gas, volume of silicon, humidity, metallic layer thickness, silicon post dimensions, type of metals in metallic layer, . . . ). The growth of nanotube bridges can be evaluated based on parameters such as: electrical characteristics, number of nanotubes, orientation of nanotubes, strength of nanotube bonds, etc. The obtained data can be utilized to optimize the number, length, thickness and quality of nanotube bridges. Furthermore, the log system component 610 can track the availability of materials needed for the manufacturing process (e.g., copper, carbon, gases, . . . ) and alert the user that materials need to be replenished.

Figure 7:
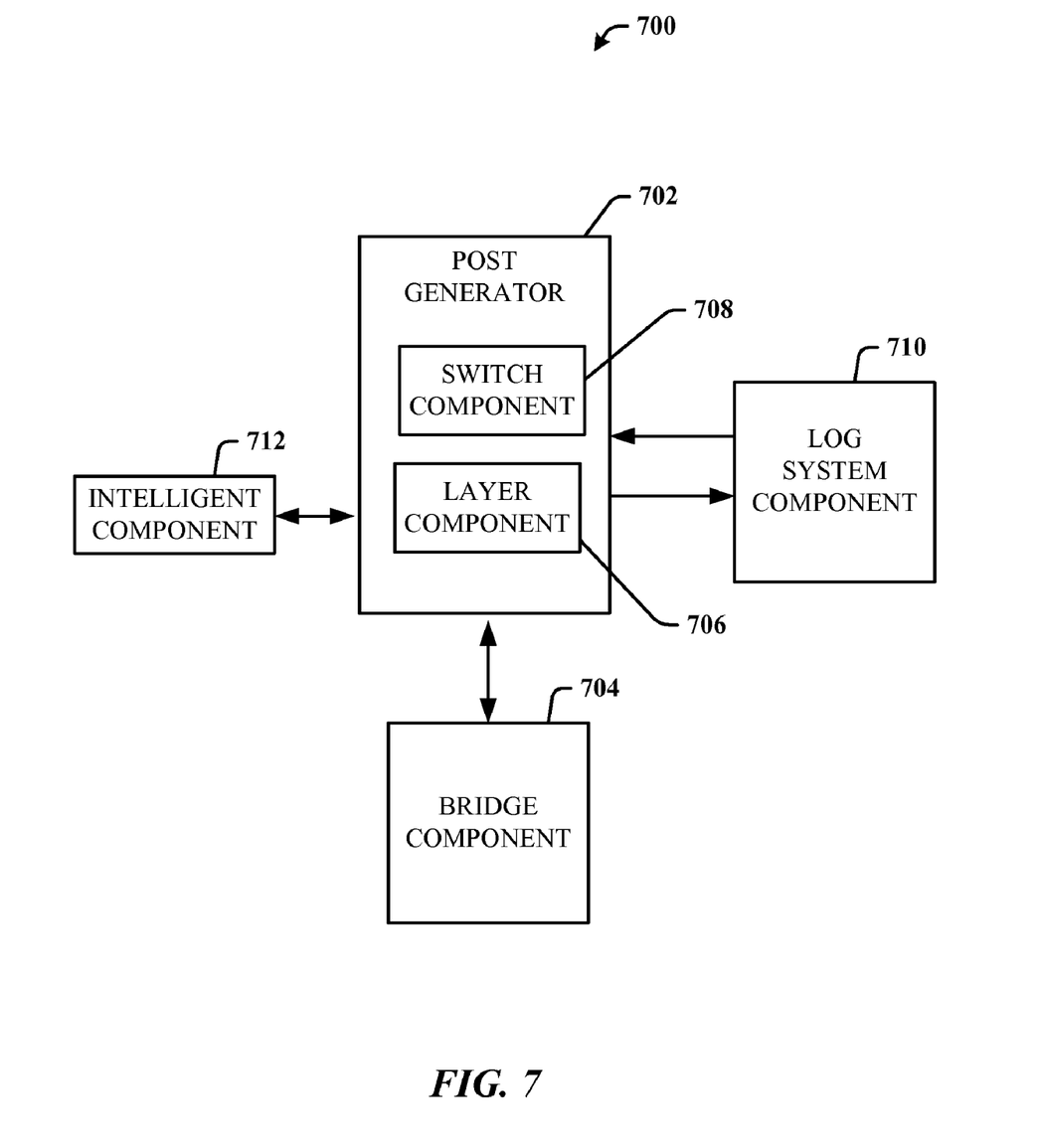
FIG. 7 illustrates a block diagram of an exemplary system that facilitates growing a nanotube bridge utilizing a smart device.

FIG. 7 illustrates a system 700 that utilizes a post generator 702 to create the at least two disparate posts. A metallic layer created using a layer component 706 can facilitate the growth of the at least one nanotube bridge between two separated silicon posts using a bridge component 704. The switch between two distinct silicon posts can be created using the switch component 708. The system 700 can include the log system component 710 that facilitates storing and/or accessing data.

The system 700 can additionally include an intelligence component 712 to facilitate utilizing the log system component 710 data to identify and define manufacturing steps performed in creating at least one nanotube bridge and/or the switch between the two disparate posts. The intelligent component 712 can be utilized by the post generator 702 and the bridge component 704 to facilitate implementation of the log system component 710 data (e.g., manufacturing data, user defined data, post data, nanotube bridge data, . . . ). For example, the intelligent component 712 can infer the post and/or bridge characteristics necessary to complete an integrated circuit as it goes through the manufacturing process, adding circuit posts, adding or deleting nanotube bridges, installing or removing switches, etc.

It is to be understood that the intelligent component 712 can provide for reasoning about or infer states of the system, environment, and/or manufacturing process from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines, . . . ) can be employed in connection with performing automatic and/or inferred action in connection with the claimed subject matter.

Figure 8:
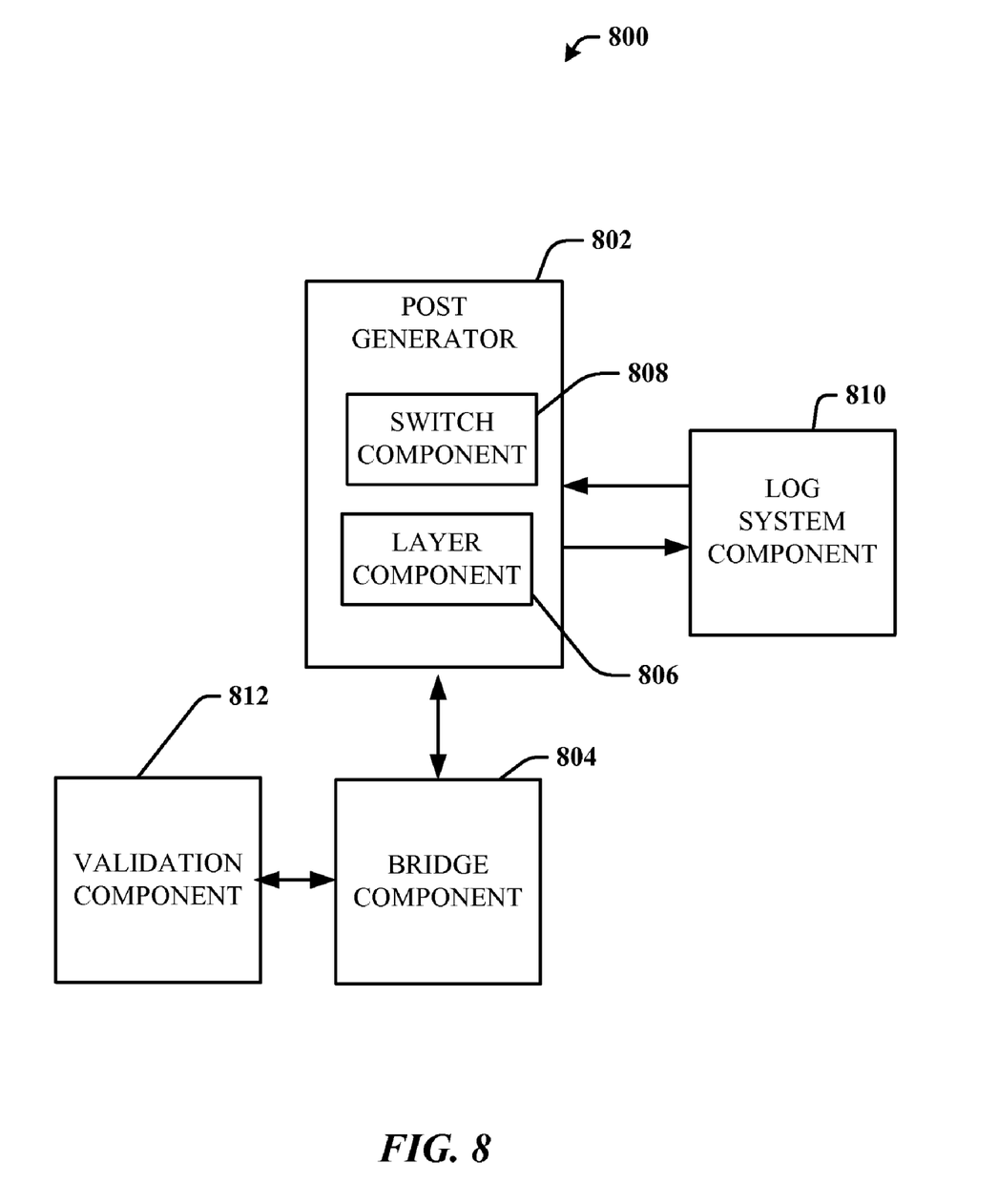
FIG. 8 illustrates a block diagram of an exemplary system that facilitates validating nanotube bridge growth.

FIG. 8 illustrates an exemplary system 800 that includes validation component 812, which can be utilized by a post generator 802 and/or a bridge component 804. The system 800 can include a post generator 802, a bridge component 804, and a log system component 810. The validation component 812 can measure mechanical and/or electrical characteristics of a produced nanotube bridge, a silicon post, a switch, a connection between a nanotube bridge and a post, etc. The validation component 812 can also include a database comprising manufacturing data and/or user defined data. The extended data and/or user defined data can be utilized to encode information that can be directly and/or indirectly utilized by automation devices that operate on the product and/or object. Manufacturing data can also be communicated, utilizing one or more environmental sensors in the validation component 812 (e.g., temperature, gas flow, humidity, voltage, current, vibration, . . . ).

Figure 9:
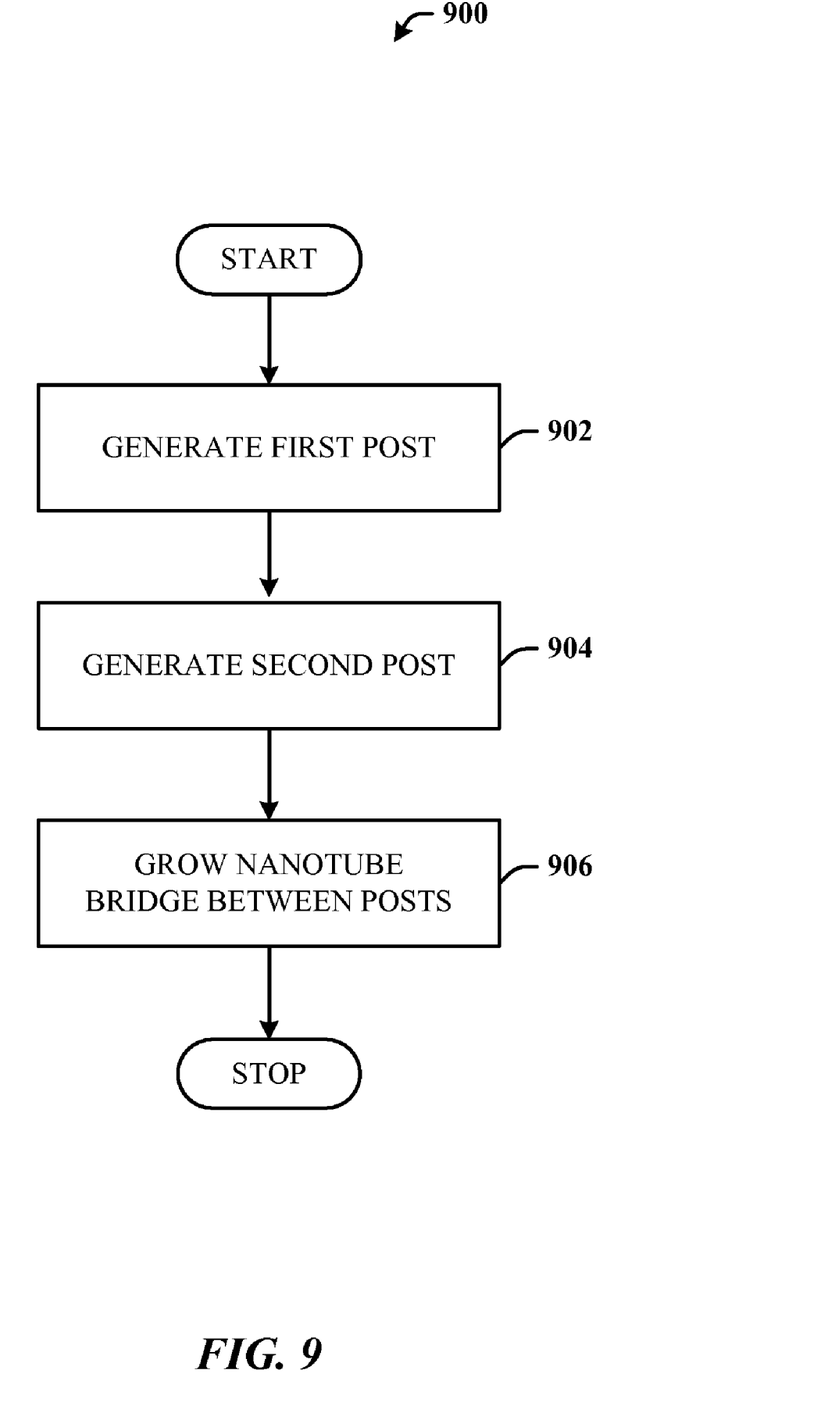
FIG. 9 illustrates a methodology that facilitates growth of a nanotube bridge between two posts.
Figure 10:
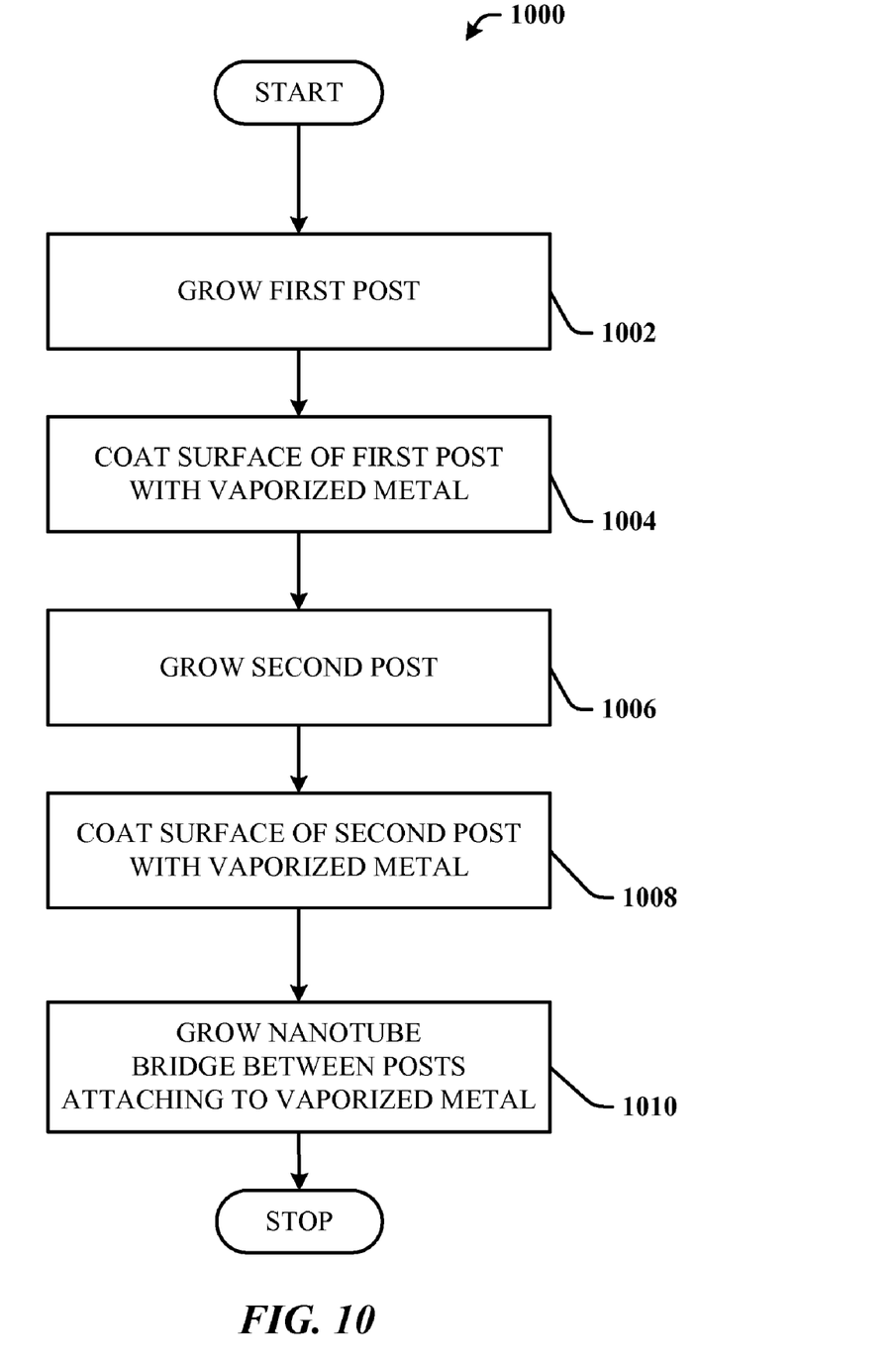
FIG. 10 illustrates a methodology that facilitates growth of a nanotube bridge between two posts having vaporized metallic layers.
Figure 11:
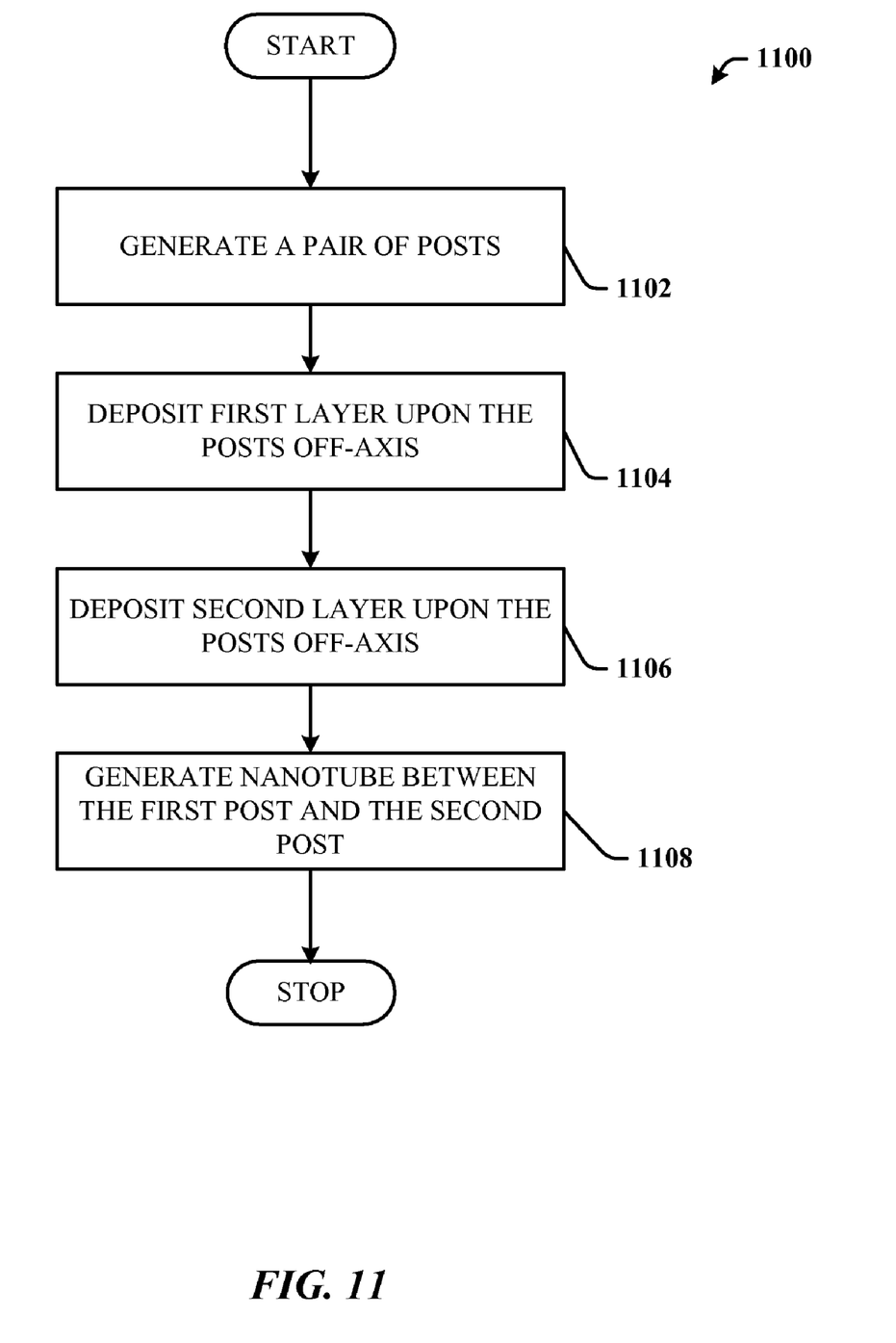
FIG. 11 illustrates a methodology that facilitates generating carbon nanotubes.

FIGS. 9-11 illustrate methodologies in accordance with the claimed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events.

FIG. 9 illustrates a methodology 900 for creating a nanotube bridge between two disparate silicon posts. At 902, a first post is generated. It is to be appreciated and understood that the post can be generated with any dimensions and/or characteristics (e.g., height, width, density, material properties, . . . ). The first post can be produced via employing low pressure chemical vapor deposition (LPCVD), deep reactive ion etching, etc.; however, the subject claims are not limited to such examples. At 904, a second silicon post is generated. The second post can be produced utilizing a similar or a disparate technique as compared to the first post. Further, the first post and the second post can be generated at substantially the same time, at disparate times, etc. Further, the first post and the second post can be situated upon a common substrate or disparate substrates.

At 906, a nanotube bridge is grown from the first silicon post and self-welds to the second silicon post. For instance, the self-welded nanotube bridge can be utilized to create an electrical connection between two disparate posts. The nanotube bridge connections on the disparate posts are substantially similar in relation to voltage and current characteristics. The substantial similarity of the connections can offer outstanding electrical, mechanical and thermal characteristics. The electrical connections can reduce the uncertainties often associated with electrical device characteristics. Small electronic devices can be fabricated with less electrical rework and a lower rejection rate. In addition, the bond strength of the nanotube bridge connection can be higher than self-welded silicon nanowires. The connection strength can be measured using an atomic force microscope (AFM) technique. In particular, this connection strength can be utilized to create more durable and robust miniaturized devices.

FIG. 10 illustrates a methodology 1000 for creating a nanotube bridge between two disparate posts. At 1002, a first silicon post is generated. At 1004, the post can have a metallic layer deposited on at least one surface. The metallic layer can be deposited off-axis with the post masked so that only a small layer of material is deposited on the upper surface of the post. It is to be understood and appreciated that the metallic layer can include a plurality of metallic layers deposited on select surfaces of the post. At 1006, a second silicon post is generated. At 1008, the second post can have at least one metallic layer deposited on at least one of its surfaces. At 1010, a nanotube bridge is grown from the first post metallic layer and self-welds to the second post metallic layer.

For example, the growth of the nanotube bridge can be controlled so that the nanotubes grow in-between the gap between the disparate posts, while mitigating growth in other regions. In particular, an aluminum metallic layer deposited on the post can prevent and/or inhibit the nanotube bridge growth in that region. The aluminum can act as a growth inhibitor, which can occur under certain conditions (e.g., temperature, gas flow rate, . . . ) to suppress nanotube bridge creation. One potential mechanism for this growth suppression is that at a high temperature the aluminum can be soft and dissolve the iron nanoparticles, diminishing their ability to grow. Furthermore, nanotube bridges can be inhibited from growing in other regions such as, for example, on the walls of the side region of the post, possibly due to the surface currents that can generate strong boundary layer shear forces and currents. In addition, the nanotube bridges can be suspended away from the posts using a combination of surface gas currents and van der Wall interactions.

FIG. 11 illustrates an example methodology 1100 for generating CNTs. At 1102, a pair of posts can be generated. For instance, the posts can be silicon-on-insulator (SOI) posts yielded by way of photolithography and deep-reactive ion etching. According to an example, the posts can have line widths ranging from 1 to 10 μm. Further, the pair of posts can be oriented as matching pairs with spacing ranging from 2 to 10 μm. Moreover, each post can be connected to a larger area of silicon that can have an aluminum pad patterned upon it (e.g., 150 μm square aluminum pad, pad with any size, . . . ). Additionally, the wafers can be sputtered with aluminum. For example, 2000 Å of aluminum can be sputtered at 750 watts at 5 mT with 10 sccm of argon. Further, the wafers can be subjected to an in-situ rf cleaning before metal deposition. The wafers can be patterned with photoresist and the aluminum can be wet etched. After cleaning the resist with acetone and methanol, the wafers can again be patterned with photoresist for the DRIE process. Also, the SOI wafers can be DRIE etched. For instance, the silicon epitaxial layer can be 18±2 μm thick. Due to the 1 μm line widths, etching can utilize a high anisotropy and can be effectuate without notching at the oxide etch stop. Shorter polysilicon structures with 1 μm high posts can also be fabricated. Further, the polysilicon wafer can be etched at 200 watts and 400 mT with 80 sccm of $Cl_2$ and 120 sccm of He. The polysilicon can be 1 μm thick and there can be an oxide underneath that measures 1000 Å thick. After DRIE and etching, the wafers can be cleaned with acetone and methanol, and ashed in an oxygen plasma.

At 1104, a first layer can be deposited upon the posts off-axis. For example, the first layer can be a layer of iron. The iron layer can be deposited off-axis in a thermal evaporator and can be 100 Å, for instance. At 1106, a second layer can be deposited upon the posts off-axis. The second layer can be amorphous carbon, copper, and the like. By depositing the first and second layers in an off-axis manner, the first layer can be exposed upon one post from a pair and the second layer can be exposed upon the other post from the pair. At 1108, a nanotube can be generated between the first post and the second post. For instance, low-pressure chemical vapor deposition (LPCVD) may be utilized in connection with thermally heating in an argon gas flow at 750-800 C in $10^{-4}$ Torr (e.g., for 5 minutes). After reaching 750 C, acetylene gas (50 sccm) can be introduced through an opening located above the chip and CNT growth can be effectuated with both acetylene and argon gasses flowing at 50 sccm (e.g., for 15 minutes). Subsequently, the acetylene can be turned off and the temperature can be returned to room temperature in the argon gas flow (50 sccm). According to an example, samples with bridging CNTs can be mounted in an atmospheric pressure chemical vapor deposition chamber and can be sulfidized using a sulfur vapor carried by argon at 150 C while the samples are at 130 C (e.g., the argon flow rate can be around 2 ml/min).

It is to be appreciated that CNTs may be generated (at least in part) utilizing an example computing environment. Additionally or alternatively, CNTs yielded as described above may be employed in connection with the example computing environment. For instance, CNTs can be leveraged in non-volatile memory that can be employed with the example computing environment (e.g., retain data generated in the example computing environment, transfer data stored in the non-volatile memory, however, it is to be appreciated that the claimed subject matter is not so limited.

Pursuant to an example, a copper layer can be deposited upon a generated CNT, and thereafter, the copper can be sulfidized to produce a thin layer of copper sulfide that forms a junction with the CNT. The CNT-CuS junction exhibits switching characteristics applicable in non-volatile memory devices. For instance, upon injection of electrons into the CuS by the negatively-biased CNT, a region with neutral Cu atoms can be formed that has metallic conductivity. Further, when voltage polarity is reversed, the Cu-rich region can become depleted and the conductivity can decease such that the device can be switched off. Thus, CNTs can be utilized to form junctions with nano-meter scale areas with a solid-electrolyte (e.g., CuS, . . . ), and the formation can be utilized in non-volatile memory devices, gas sensors, and the like. By employing CNTs, small devices can result due to small contact areas associated with the CNTs (e.g., diameters in the range of 1-100 nm). CNT-wired solid-electrolytic memories can be utilized with computing devices due to their cross-bar geometry and nanometer scale since they can be manufactured with very high device densities in excess of 10 billion memory elements per square centimeter chip area, for example.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims.

Appendices A, B and C provide illustrations/examples in connection with various aspects of the innovation, and these appendices are considered part of the detailed description of this application.

Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates bridging posts utilizing nanotubes, comprising:
   a post generator that creates a first post and a second post; and
   a bridge component that connects the first post and the second post by growing at least one carbon nanotube such that the at least one carbon nanotube originates from the first post and self welds to the second post, the bridge component provides an electrical connection between the first post and the second post, wherein the bridge connection to the first post is similar in relation to voltage and current characteristics as the bridge connection to the second post.

2. The system of claim 1, the at least one carbon nanotube is self-aligned to be perpendicular with a face of the first post that a first end of the at least one carbon nanotube extends from.

3. The system of claim 1, the at least one carbon nanotube between the first post and the second post exhibits switching characteristics applicable in non-volatile memory devices.

4. The system of claim 1, the at least one carbon nanotube between the first post and the second post is utilized as a device on an integrated circuit.

5. The system of claim 1, the post generator creates the first post and the second post with at least one layer of deposited metal.

6. The system of claim 5, the at least one layer of deposited metal is at least one of the following: carbon, copper, palladium, titanium, titanium carbonade, and iron.

7. The system of claim 5, the at least one layer of deposited metal is vapor deposited off-axis.

8. The system of claim 1, the at least one carbon nanotube is grown in a gas flow.

9. The system of claim 8, the gas is at least one of acetylene and argon gas.

10. The system of claim 1, further comprising an atomic force microscope that measures the mechanical strength of the at least one carbon nanotube.

11. A system for generating carbon nanotube structure, comprising:
    means for growing a carbon nanotube bridge to a second post from a first post from which it is generated;
    means for self-welding the carbon nanotube bridge to the second post; and
    means for providing an electrical connection between the first post and the second post, wherein the carbon nanotube bridge connection to the first post is similar in relation to voltage and current characteristics as the carbon nanotube bridge connection to the second post.

* * * * *